US006686805B2

(12) United States Patent
Cyrusian

(10) Patent No.: US 6,686,805 B2
(45) Date of Patent: Feb. 3, 2004

(54) ULTRA LOW JITTER CLOCK GENERATION DEVICE AND METHOD FOR STORAGE DRIVE AND RADIO FREQUENCY SYSTEMS

(75) Inventor: Sasan Cyrusian, Scotts Valley, CA (US)

(73) Assignee: Infineon Technologies AG, San Jose, CA (US)

( * ) Notice: Subject to any disclaimer, the term of this patent is extended or adjusted under 35 U.S.C. 154(b) by 50 days.

(21) Appl. No.: 09/865,780

(22) Filed: May 25, 2001

(65) Prior Publication Data

US 2002/0175771 A1 Nov. 28, 2002

(51) Int. Cl.⁷ .............................................. H03B 27/00

(52) U.S. Cl. .............................. 331/25; 331/25; 331/45; 331/74

(58) Field of Search .............................. 331/45, 74, 25; 327/159, 160, 151, 261, 273, 279, 286

(56) References Cited

U.S. PATENT DOCUMENTS

| | | | |
|---|---|---|---|
| 5,668,504 A | | 9/1997 | Rodriques Ramalho |
| 5,877,657 A | * | 3/1999 | Yoshinaka ................... 331/16 |
| 5,920,596 A | * | 7/1999 | Pan et al. ................... 375/238 |
| 6,111,712 A | | 8/2000 | Vishakhadatta et al. |
| 6,137,336 A | | 10/2000 | Baba et al. |
| 6,288,589 B1 | * | 9/2001 | Potter et al. ................. 327/295 |

OTHER PUBLICATIONS

"Synchronous Recording Channels—PRML & Beyond", rev. 5.61 14.E.18, 1999, published by Knowledge Tek, Inc., Broomfield, Colorado.
PRML: Seagate Used Space Age Technology Today, available at http://www.seagate.com/support/kb/disc/prml.html (2001), printed on Apr. 9, 2001, 2 pages.
Industry Technologies—PRML, Technologies Storage, availabe at http://wwww.idema.org/about/industry/ind tech prml.html (2001), printed on Apr. 9, 2001, 1 page.
Kozierok, Charles M., Hard Disk Data Encoding and Decoding, available at http://www.storagereview.com/guide2000/ref/hdd/geom/data.html (2001), printed on Apr. 9, 2001, 2 pages.
Kozierok, Charles, M., Technical Requirements for Encoding and Decoding, available at http://www.storagereview.com/guide 2000/ref/hdd/geom/dataRequirements.html (2000), printed on Apr. 9, 2001, 3 pages.
Kozierok, Charles M., Run Length Limited (RLL), available at http://www.storagereview.com/guide2000/ref/hdd/geom/dataRRLL.html (2000), printed on Apr. 9, 2001, 3 pages.
Kozierok, Charles M., Partial Response, Maximum Likelihood (PRML), available at http://www.storagereview.com/guide2000/ref/hdd/geom/dataPRML.html (2000), printed on Apr. 9, 2001, 3 pages.
Kozierok, Charles M., Extended PRML (EPRML), available at http://www.storagereview.com/guide2000/ref/hdd/geom/dataEPRML.html (2000), printed on Apr. 9, 2001, 2 pages.

(List continued on next page.)

*Primary Examiner*—Robert Pascal
*Assistant Examiner*—Kimberly E Glenn
(74) *Attorney, Agent, or Firm*—Brinks, Hofer Gilson & Lione

(57) ABSTRACT

A clock generation device includes a delay-locked loop and a plurality of programmable counters. The plurality of programmable counters are coupled to delay-locked loop. Each of the programmable counters has a separate output. The delay-locked loop is configured to generate a plurality of phase delay line outputs. A hard drive includes the delay-locked loop and the programmable counters, which generate multiple timing signals such as read, write, servo, and system timing signals. The method of generating timing signals includes delaying an input signal by a programmable delay and generating a plurality of timing pulses through the programmable counters.

23 Claims, 4 Drawing Sheets

OTHER PUBLICATIONS

MR and PRML: Technologies in Synergy, available at http://www.lionsgate.com/Home/baden/public_html_index/SCSI/Quantum_White_Papers/MR_Head/MR (1996), printed on Apr. 9, 2001, 4 pages.

Western Digital Corporation—Glossary of term Viterbi Detection, available at http://www.westerndigital.com/company/glossary.html (2001), printed on Apr. 9, 2001, 1 page.

Fleming, Chip, A Tutorial on convolutional Coding with Viterbi Decoding, available at http://pwl.netcom.com/~chip.f/viterbi/tutorial.html (2001), printed on Apr. 9, 2001, 4 pages.

Fleming, Chip, A Tutorial on Convolutional Coding with Viterbi Decoding—Description of the Data Generation, Co. . . . v, available at http://pwl.netcom.com/~chip.f/viterbi/algrthms.html (2001), printed on Apr. 9, 2001, 6 pages.

Using the Virtex Delay–Locked Loop, Advanced Application Note, XAPP 132, Oct. 21, 1998 (Version 1.31) 14 pages.

Telecommunications Dictionary, available at http://www.ctechsolutions.com/dictionary.htm, (2002), printed Sep. 9, 2002, p. 44.

Using the Virtex Delay–Locked Loop, XAPP 132, Jul. 11, 2002 (Version 2.5), printed Aug. 30, 2002, 11 pages.

* cited by examiner

ULTRA LOW JITTER CLOCK GENERATION DEVICE AND METHOD FOR STORAGE DRIVE AND RADIO FREQUENCY SYSTEMS

CROSS REFERENCE TO RELATED APPLICATION

The following commonly assigned U.S. patent application relates to and further describe other aspects of the presently preferred embodiments disclosed in this application and is incorporated by reference in its entirety.

U.S. patent application Ser. No. 09/676,277, "High Resolution, Low Jitter Frequency Synthesizer," filed on Sep. 28, 2000, and is now abandoned.

FIELD OF THE INVENTION

This invention relates to a clocking system, and more particularly, to a device and method that reduce jitter and generate clock signals.

BACKGROUND

Read, write, and servo channels used in hard drives can require three different clock sources. A read and write head can require separate clock signals to transform electrical signals into magnetic signals and magnetic signals into electrical signals, respectively. A servo can require a separate clock signal to accurately position a head on or above a surface of a hard drive platter. In each of these systems, the clock pulses are very high frequency clock pulses.

Clock management of read, write, and servo channels can be handled by multiple clock synthesizers that have a programmable output frequency over a wide bandwidth. One operational concern of some multiple clock synthesizers is the large amount of power these synthesizers can consume when distributing timing pulses. Multiple clock synthesizers having a large programmable frequency bandwidth can use multiple pairs of transistors that require high voltage biases to achieve high operating frequencies. Moreover, some oscillators contained within clock synthesizers can introduce and accumulate phase error. The phase error can degrade the performance of some clock synthesizers.

BRIEF DESCRIPTION OF THE DRAWINGS

In the figures, like reference numerals designate similar parts throughout different views.

SUMMARY

The present invention is directed to a high bandwidth clock generation device and method of clock pulse generation that is insensitive to voltage and process variations and minimizes frequency jitter and power consumption. The presently preferred clock generation device includes a delay-locked loop and a plurality of programmable counters. The plurality of programmable counters are coupled to the delay-locked loop at common inputs. Each of the programmable counters has a separate output. The delay-locked loop is configured to generate a plurality of phase delay outputs. A presently preferred storage device includes the delay-locked loop and the programmable counters. The programmable counters generate multiple timing signals such as a read, a write, a servo, and a system timing pulse.

A presently preferred clock generating method delays an input signal by a programmable delay. A plurality of delay signals are generated by the delay-locked loop and a plurality of timing pulses are generated by the plurality of programmable counters.

DETAILED DESCRIPTION OF THE PRESENTLY PREFERRED EMBODIMENTS

A hard drive is an electromechanical device that reads from or writes to platter(s) made of or coated with material(s) that store data. A hard drive can include a spindle on which the platter(s) are supported, motor(s) that drive the platter(s), one or more read/write heads, head positioning mechanisms, a power supply, and a controller. Many streams of timing pulses synchronize the operation of a hard drive. Both read and write timing pulses, for instance, coordinate read/write heads that convert changes in magnetic fields stored on a platter into changing electrical signals and vice versa. When write pre-compensation is used, the write timing pulses are further time shifted to offset the effects of bit shifts in magnetic recordings. In a servomechanism, a separate timing pulse is used to accurately position the read/write heads on or above the surface of the hard drive platter(s).

Figure 1:
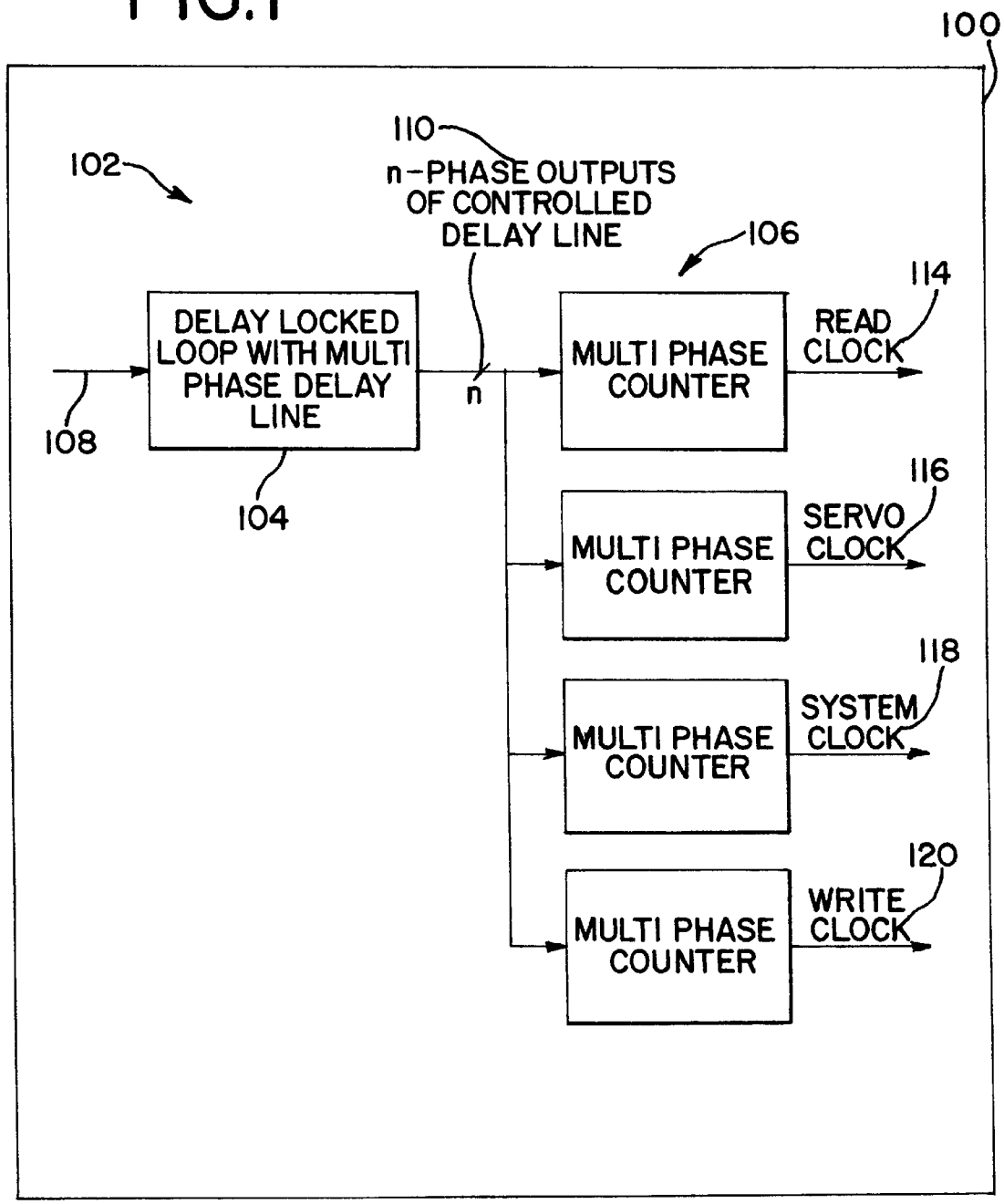
FIG. 1 is a functional diagram of a presently preferred embodiment.

FIG. 1 is a functional diagram of a presently preferred embodiment. The presently preferred embodiment 102 comprises a synthesizer 104 and multiple counters 106. Preferably, the synthesizer 104 generates a delayed version of an input signal received at the input terminal 108. As shown, a delay-locked loop (DLL) 104 having multiple phase delay lines conditions an input signal into n-phase outputs of the controlled delay line ("n-phase outputs") 110. In other words, preferably the delay-locked loop 104 drives multiple or "n" phase delayed output lines. Preferably, the delay-locked loop 104 inserts multiple programmable delays between the input signal and an internal feedback signal. In this presently preferred embodiment, the multiple phase delay lines delay the output of the phase number "n" 110 by about three hundred and sixty degrees from the input signal. In other words, the input and the internal feedback signals are substantially in phase but delayed by about a period or a full cycle. Preferably, when the internal feedback signal and the input signal align, the delay-locked loop "locks." A "locked" condition indicates that there is substantially little difference between the input signal and the internal feedback signal.

Preferably, the outputs of the delay-locked loop 104 drive more than one counter. Preferably, the counters are multi-phase counters 106 that track phase angles of the n-phase outputs 110 of the delay-locked loop 104. The multi-phase counters 106 make multiple measurements of the n-phase outputs 110 and further make comparisons to predetermined or programmed values. In one of the presently preferred measuring modes, the multi-phase counters 106 count the phase transitions of the n-phase outputs 110. Preferably, the monitoring of both the voltage threshold and the slope of the n-phase outputs 110 are adjustable, meaning the preferred multi-phase counters 106 can track a wide range of signal amplitudes and frequencies. When the multi-phase counters 106 measure or count a predetermined number of phases, the multi-phase counters 106 generate outputs before re-initializing their respective counts. Preferably, the multi-phase counter 106 outputs are timing pulses that are precisely generated from a single timing source that comprises the delay-locked loop 104.

To achieve different timing frequencies between a read 114, a servo 116, a system 118, and a write clock 120, each multi-phase counter 106 has at least one predetermined or programmable threshold or reference count. When the reference count is reached, the multi-phase counter 106 generates one or more timing pulses that preferably coordinate other circuit functions. Preferably, each multi-phase counter 106 can be configured or programmed to track one or several counts and generate outputs when different reference counts are reached. Accordingly, each multiphase counter 106 can generate many dynamic-timing functions. For instance, the write clock output 120 can also generate dynamic "time shifted" timing pulses that can be used in a write pre-compensation to offset the effects of bit shifts in magnetic recordings. By re-programming the threshold or reference count in real time or between write cycles, the presently preferred embodiments can "time shift" the writing of data to offset bit shifts that can occur on a magnetic media such as a platter coated with magnetic material. Thus, the threshold or reference count can be programmed as the multiphase counter 106 counts the phase occurrences in real time.

Figure 2:
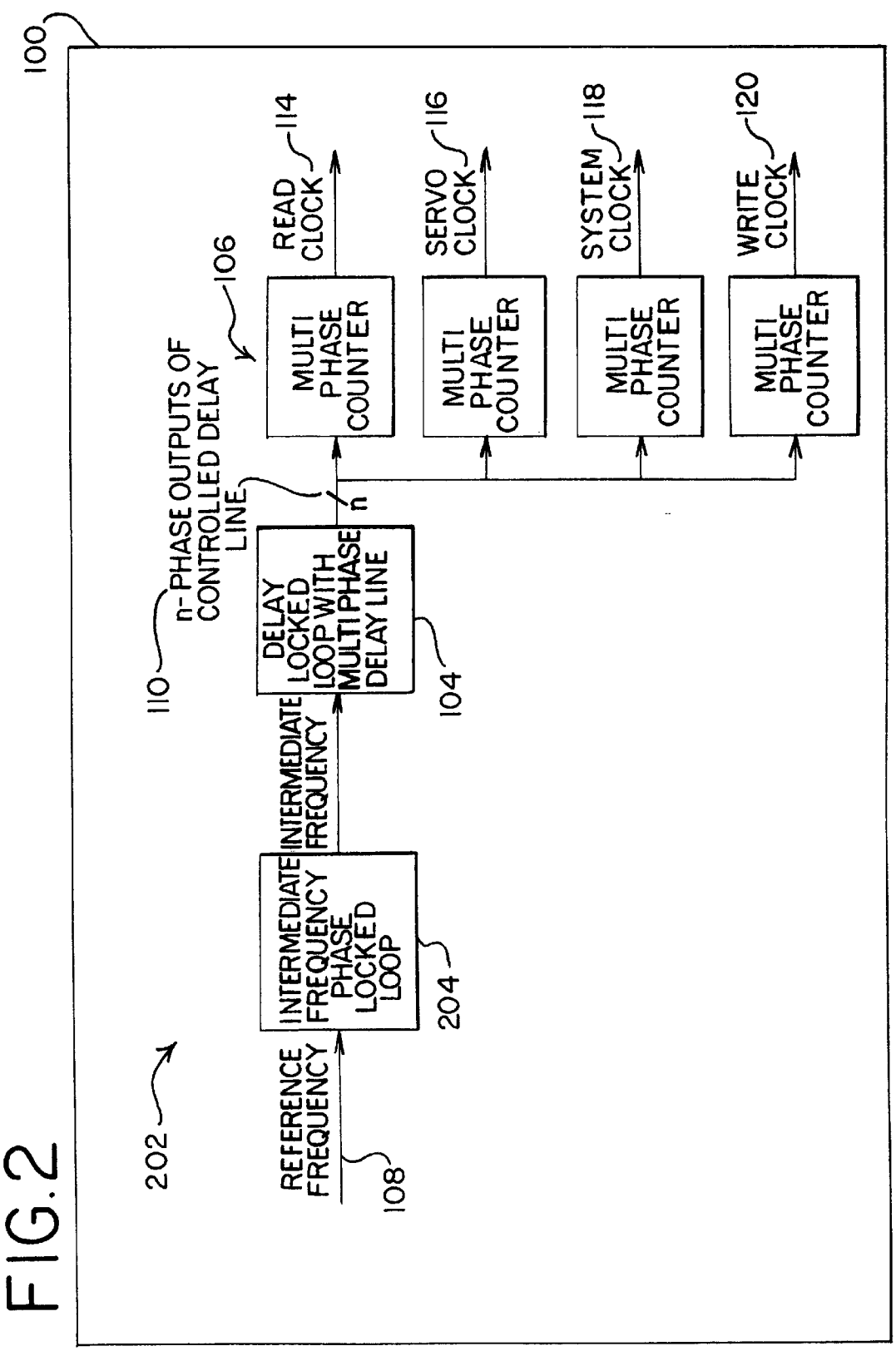
FIG. 2 is a functional diagram of a second presently preferred embodiment-incorporating FIG. 1.

Preferably, the delay-locked loop 104 does not accumulate phase error, and thus, can provide precise clock conditioning. Accordingly, the delay-locked loop 104 can condition the output of a synthesizer that includes a phase-locked loop 204. As shown in FIG. 2, in a second presently preferred embodiment 202 the delay-locked loop 104 conditions the output of an intermediate frequency synthesizer 204. In this presently preferred embodiment, a phase-locked loop 204 generates a fixed multiple of the input frequency of an input signal received at the input terminal 108. The input signal can be an analog signal or a digital signal.

Figure 3:
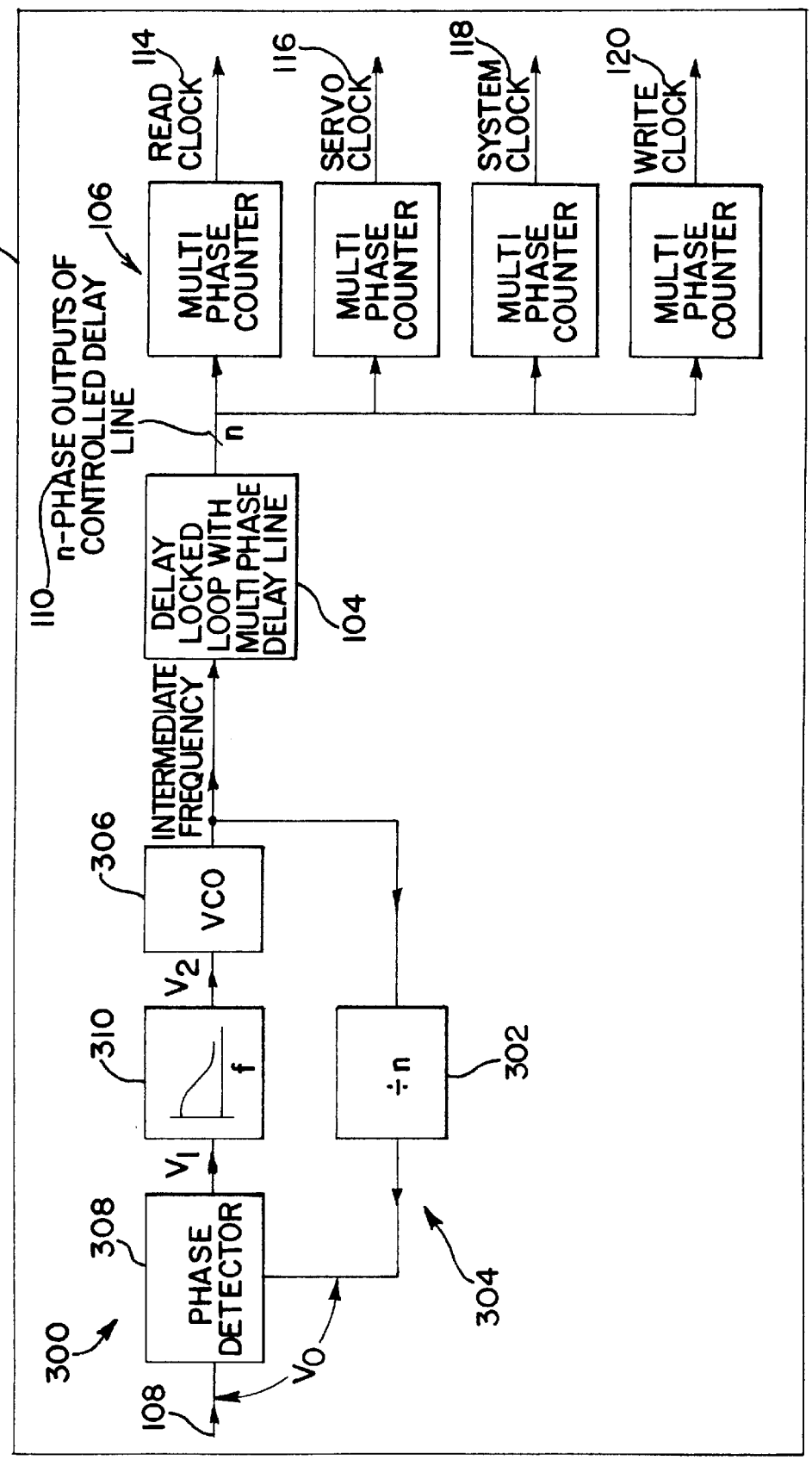
FIG. 3 is a functional diagram of the second presently preferred embodiment illustrating discrete components.

The above-described embodiments can be implemented using digital or analog circuitry. While the digital implementations can have low noise sensitivities, consume little power, and have an effective jitter performance, an analog implementation can produce a fine resolution. FIG. 3 shows an analog implementation of a synthesizer as a frequency multiplier. In this presently preferred embodiment 300, a frequency-multiplied signal comprises the intermediate frequency signal conditioned by the delay-locked loop 104.

As shown in FIG. 3, a divide-by-n counter 302 can be disposed within a negative feedback loop 304 between a voltage-controlled oscillator (VCO) 306 and a phase detector 308. The phase detector 308 receives the reference signal and an output signal generated by the divide-by-n counter 302. The phase detector 308 compares the reference signal to the divide-by-n counter 302 output signal and produces a direct current (DC) signal that is proportional to the phase difference between the input signals. A loop filter 310, which is preferably a low pass filter, removes the high frequency content from the phase detector 308 output. The voltage-controlled oscillator 306 receives the filtered input signal and generates an oscillating output signal. Preferably, the divide-by-n counter 302 generates its output signal using multi-phase outputs of the voltage-controlled oscillator 306. This increases the resolution of the feedback divide-by-n counter 302. Thus, the presently preferred synthesizer shown in FIG. 3 generates a multiple of the input reference signal. Accordingly, the intermediate frequency signal is a multiple of the input reference signal received at the input 108.

Preferably, the phase detector 308 is driven by an analog or digital signal. In the above-presently-preferred embodiments, the voltage-controlled oscillator 306 can include a fixed or tunable LC oscillator having narrow or wide oscillating ranges. The voltage-controlled oscillator 306 need not be limited to logic speeds, as the above-described presently preferred embodiments can also be used at radio frequency bandwidths or microwave frequency bandwidths and can be used to generate carrier frequencies. Of course, phase-locked loops and some of the other presently preferred synthesizers built with such voltage-controlled oscillators preferably comprise a radio frequency or a microwave frequency phase detector. Moreover, each of the oscillators described herein can comprise one or more variable capacitors, variable inductors, tuning diodes such as a varactor or a combination of these components that can be either manually or automatically tuned. The tuning diodes can be tuned through a tuning signal or an applied voltage generated by an external source.

The above-described-presently preferred embodiments can be modified into many alternative embodiments. For instance, one or more delay elements can be disposed within the negative feedback loop 304 between the voltage-controlled oscillator (VCO) 306 and a phase detector 308. Moreover, more than one divide-by-n counter can also be disposed between the phase detector 308 and voltage-controlled oscillator 306. By interconnecting more than one divide-by-n counter 302 in series between the phase detector 308 and voltage-controlled oscillator 306, for example, a multiple of the input signal can be generated at an output.

Moreover, the invention is not limited to one particular counter as any suitable counter can be used. For instance, a phase accumulator can be used to measure the occurrence or repetition of the output of the delay-locked loop 104 with multi-phase delay line and/or a phase accumulator can be connected within the negative feedback loop 304 of the above-described synthesizers shown in FIGS. 3 and 4. To generate a fixed or variable frequency timing pulse, a constant value known as a phase increment can be added to a count within the phase accumulator with each multi-phase oscillator output. Preferably, when the phase accumulator reaches predetermined values, such as a multiple of a programmed count, the phase accumulator generates a timing pulse or timing impulse. Preferably, the phase accumulator re-initializes when reaching a predetermined value, such as when a timing pulse or timing impulse is generated, for example. Accordingly, a phase accumulator can generate a timing impulse in the time domain that corresponds to the time difference between two adjacent and different phases in the frequency domain. In each of the above-described presently preferred embodiments, the timing pulses can be generated by the counter or by an external circuit, such as a look up table. Other counters can also be used. For example, a non-integer divider or a programmable non-integer divider can be used to generate timing pulses. Preferably, the divisor of the programmable non-integer divider is programmable. When used to generate timing signals for the write clock 120, preferably the divisor can be programmed in real time to offset the effects of bit shifts that can occur in magnetic media. Accordingly, the programmable non-integer divider can generate dynamic "time shifted" timing pulses that can be used in a write pre-compensation.

Figure 4:
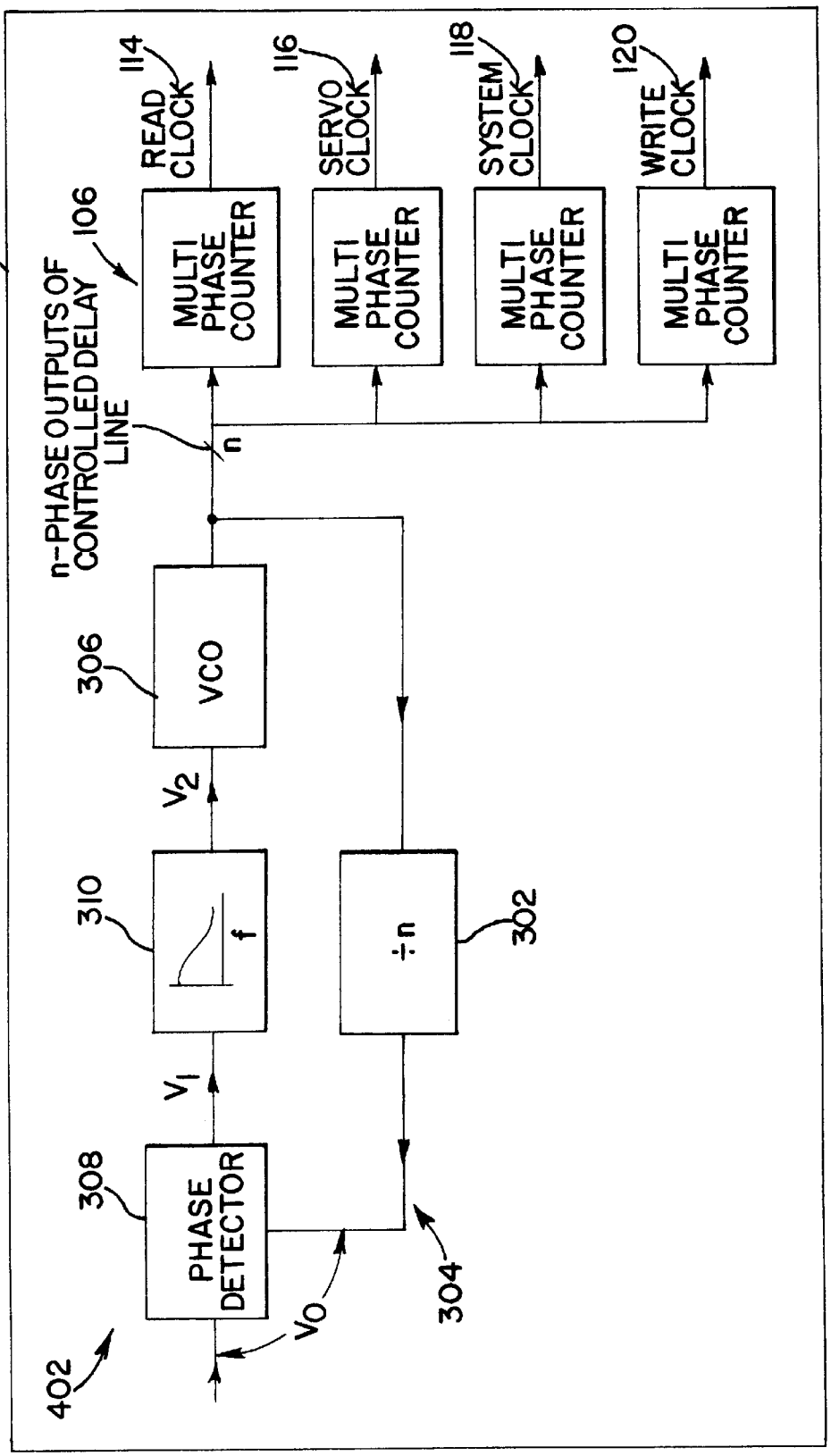
FIG. 4 is a functional diagram of the third presently preferred embodiment.

FIG. 4 illustrates a third presently preferred embodiment 402. As shown, the frequency synthesis of the delay locked loop 104 of FIG. 1 is implemented by the analog synthesizer illustrated in FIG. 3. Preferably, the voltage-controlled oscillator 306 converts the direct current output voltage of the phase detector 308 to the time derivative of phase, which is frequency. In this presently preferred embodiment 402, the voltage-controlled oscillator 306 is a low-phase-noise voltage-controlled oscillator that generates "n" phases. The output of the voltage-controlled oscillator 306 is directly connected to the multi-phase counters 106, which maximizes output amplitude. In alternative preferred embodiments many other counters can be used, including each of the above-described counters. In yet another alternative presently preferred embodiment, an integrated phase-locked loop can directly couple the input signal and can be directly connected to any of the above-described counters.

The above-described presently preferred embodiments can be used within many devices including radio and microwave frequency circuits, repetitive storage devices, hard drives 100, and other electromechanical devices. In hard drives 100, the above-described presently preferred embodiments can use the delay-locked loop 104 to generate several equidistant phases or varying clock frequencies for the read, write, and servo clocks 114, 116, and 120 within a hard drive 100 as well as a system clock 118, a controller clock, a micro-controller clock, and/or an interface clock. When write pre-compensation is used, a repetitively programmed counter can be used to "time shift" the write clock 120 timing signal. Preferably, the write pre-compensation compensates for bit shifting that can occur on hard drive recording media such as platters. Accordingly, from one write cycle to the next, the reference count can be re-programmed. Thus, when programmable counts or thresholds are used, some programmed clock frequencies will automatically reflect the condition of the hard drive recording media. In addition to the above, the presently preferred embodiments can generate a system clock 118 that drives the overall processing speed of peripheral circuits and systems. Accordingly, the above-described hard drives 100 can generate the master system clocks for many electronic systems and controllers.

One example of such use occurs when a 40 MHz reference frequency is used to generate about 100 MHz to about 1 GHz timing frequencies. In this exemplary use, a delay line having 64 outputs is locked to about a 2 GHz signal generated by an LC oscillator. The delay-locked loop generates 32 output signals having a time interval of about 500 Pico-seconds/32 between adjacent phases. Three multi-phase counters were used to generate about 100 MHz to about 1 GHz timing frequencies. These timing frequencies were achieved by counting between about 64 and 640 phases. Like the presently preferred embodiments, the exemplary timing frequencies can be used for the read 114, write 120, read/write, servo 116, and/or the system clocks 118 within a hard drive 100 as well as a controller, a micro-controller, and/or interface clock. When used to generate the write 120 or the read/write signals, preferably the clock can be dynamically programmed to generate a dynamic "time shifted" timing pulse that can be used in a write pre-compensation.

The above-described presently preferred embodiments simplify board design as a single circuit can generate a variety of high-speed timing signals. One circuit that generates multiple timing pulses consumes less power than multiple copies of the same circuit. To decrease noise sensitivity, improve jitter performance, and further reduce power consumption, digital implementations of the above-described embodiments can be integrated within or become a unitary part of an integrated circuit. Conversely, analog implementations can also be used in alternative preferred embodiments.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

I claim:

1. A clock generation device, comprising:
   a delay-locked loop comprising a plurality of phase delay lines; and
   a plurality of programmable counters directly coupled to the plurality of phase delay lines of the delay-locked loop, the plurality of programmable counters comprising multi-phase counters having common inputs and separate outputs configured to generate separate timing pulses, wherein the delay-locked loop is configured to generate multiple phase outputs.

2. The clock generation device of claim 1 wherein the plurality of programmable counters comprise a combination of multi-phase counters and phase accumulators.

3. The clock generation device of claim 1 wherein at least one of the plurality of programmable counters is programmed in real time while measuring at least one output of the delay-locked loop.

4. The clock generation device of claim 1 further comprising a phase-locked loop coupled to the delay-locked loop.

5. The clock generation device of claim 1 further comprising a synthesizer coupled to the delay-locked loop, the synthesizer comprising a negative feedback loop and a divide-by-n counter, wherein the divide-by-n counter is disposed within the negative feedback loop and "n" is an integer.

6. The clock generation device of claim 5 further comprising a tunable LC oscillator, wherein the tunable LC oscillator is coupled to the divide by n-counter and the delay-locked loop.

7. The clock generation device of claim 6 wherein the tunable oscillator is tuned to a radio frequency bandwidth.

8. The clock generation device of claim 7 wherein the tunable oscillator is tuned by a tuning voltage.

9. A clock generation device, comprising:
   a delay-locked loop comprising a plurality of phase delay lines; and
   a plurality of programmable counters directly coupled to the plurality of phase delay lines of the delay-locked loop, the plurality of programmable counters comprising multi-phase accumulators having common inputs and separate outputs configured to generate separate timing pulses, wherein the delay-locked loop is configured to generate multiple phase outputs.

10. A clock generation device, comprising:
    a delay-locked loop comprising a plurality phase delay lines;
    a phase-locked loop coupled to the delay-locked loop, the delay-locked loop comprising a tunable LC oscillator coupled to an output of the phase-locked loop; and
    a plurality of programmable multi-phase counters coupled to the plurality of phase delay lines of the delay-locked loop, wherein each of the plurality of counters comprise common inputs and separate outputs configured to generate separate read, write, servo, and system timing pulses, wherein the delay-locked loop is configured to generate a plurality of phase outputs.

11. A repetitive storage device, comprising:
    a delay-locked loop comprising a plurality of phase delay lines; and
    a plurality of programmable counters coupled to the delay-locked loop, wherein the plurality of counters comprise multi-phase counters having common inputs coupled to the plurality of phase delay lines and separate outputs, the separate outputs being configured to generate at least one read, write, servo, controller, and interface timing pulses, wherein the delay-locked loop is configured to generate multiple phase outputs.

12. The repetitive storage device of claim 11 wherein at least one of the plurality of programmable counters is configured to be programmed in real time while measuring an output of the delay locked loop.

13. The repetitive storage device of claim 11 further comprising a phase-locked loop coupled to the delay-locked loop.

14. A repetitive storage device, comprising:
   a delay-locked loop comprising a plurality of phase delay lines; and
   a plurality of programmable counters coupled to the delay-locked loop, wherein the plurality of counters comprise phase accumulators having common inputs coupled to the plurality of phase delay lines and separate outputs, the separate outputs being configured to generate at least one read, write, servo, controller, and interface timing pulses, wherein the delay-locked loop is configured to generate multiple phase outputs.

15. A hard drive, comprising:
   a delay-locked loop comprising a plurality of phase delay lines;
   a phase-locked loop coupled to the delay-locked loop, the delay-locked loop comprising a tunable LC oscillator coupled to an output of the phase-locked loop; and
   a plurality of programmable multi-phase counters coupled to the delay-locked loop, wherein each of the plurality of counters comprise common inputs coupled to the plurality of phase delay lines and separate outputs, the separate outputs being configured to generate separate read, write, servo, and system timing pulses, wherein the delay-locked loop is configured to generate a plurality phase outputs.

16. The hard drive of claim 15 wherein the delay-locked loop, the phase-locked loop, and the programmable multi-phase counters are a unitary part of an integrated circuit.

17. A method of generating timing pulses in a hard drive, comprising:
   delaying an input signal by a programmable delay;
   generating a plurality of phase signals using a delay-locked loop; and
   distributing a plurality of timing signals generated by a plurality of multi-phase counters coupled to the delay-locked loop.

18. The method of generating clock pulses in the hard drive of claim 17 further comprising programming a reference count in one of the multi-phase counters to time shift one of the timing signals.

19. The method of generating clock pulses in the hard drive of claim 17 wherein the plurality of timing signals comprise a read, a write, a servo, a system, and a write timing signal.

20. The method of generating clock pulses in the hard drive of claim 17 wherein the multi-phase counters comprise programmable non-integer dividers and the method further includes programming a non-integer divisor based on a position of data on a magnetic media.

21. The method of generating clock pulses in the hard drive of claim 17 further comprising a phase accumulator coupled to the delay-locked loop.

22. A hard drive, comprising:
   a delay-locked loop comprising a plurality of phase delay lines; and
   a plurality of programmable counters coupled to the plurality of phase delay lines of the delay-lock loop, wherein the plurality of counters comprise common inputs coupled to the plurality of phase delay lines and separate outputs, the separate outputs generating at least one read, write, servo, system, controller, and interface timing pulses, the read, write, servo, and system clock signals having differing frequencies and wherein the delay-locked loop is configured to generate multiple phase outputs.

23. The hard drive of claim 22 wherein the programmable counters comprise non-integer dividers.

* * * * *